(12) United States Patent
Kumada et al.

(10) Patent No.: US 6,984,473 B2
(45) Date of Patent: Jan. 10, 2006

(54) METHOD OF PATTERNING A MASK BLANK

(75) Inventors: Teruhiko Kumada, Tokyo (JP);
Atsuko Fujino, Tokyo (JP); Kazuyuki Maetoko, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 443 days.

(21) Appl. No.: 10/217,466

(22) Filed: Aug. 14, 2002

(65) Prior Publication Data

US 2003/0152845 A1    Aug. 14, 2003

(30) Foreign Application Priority Data

Feb. 12, 2002   (JP) .............................. 2002-033928

(51) Int. Cl.
  *G03F 1/00*   (2006.01)
  *G03C 5/00*   (2006.01)
(52) U.S. Cl. ........................... 430/5; 430/322; 430/324
(58) Field of Classification Search .................... 430/5, 430/322, 324
See application file for complete search history.

(56) References Cited

U.S. PATENT DOCUMENTS

| | | |
|---|---|---|
| 5,198,326 A | 3/1993 | Hashimoto et al. |
| 5,240,812 A | 8/1993 | Conley et al. |
| 5,326,675 A | 7/1994 | Niki et al. |
| 5,374,504 A * | 12/1994 | Hanson et al. .............. 430/325 |
| 5,707,784 A | 1/1998 | Oikawa et al. |
| 5,750,312 A | 5/1998 | Chandross et al. |
| 5,939,236 A | 8/1999 | Pavelchek et al. |
| 5,981,146 A | 11/1999 | Kumada et al. |

FOREIGN PATENT DOCUMENTS

JP    7-209875    8/1995

* cited by examiner

*Primary Examiner*—Geraldine Letscher
(74) *Attorney, Agent, or Firm*—Leydig, Voit & Mayer, Ltd.

(57) ABSTRACT

A light-block film is formed on a substrate, and a chemically amplified resist film is then formed on the light-block film. The chemically amplified resist film includes a photosensitive acid generator which generates an acid upon irradiation with activating light or radiation, and mainly contains a first resin that becomes soluble in bases by action of the acid. Next, a protective film is formed on the chemically amplified resist film and thereby yields a mask blank. The protective film is formed by dissolving a second resin and the photosensitive acid generator in a solvent that does not substantially dissolve the chemically amplified resist film to prepare a solution, and applying the solution to the chemically amplified resist film.

5 Claims, 5 Drawing Sheets

METHOD OF PATTERNING A MASK BLANK

CROSS REFERENCE TO RELATED APPLICATION

This application is based on Application No. 2002-33928, filed in Japan on Feb. 12, 2002, the contents of which are hereby incorporated by reference.

BACKGROUND OF THE INVENTION

1. Field of the Invention

The present invention relates to a mask blank for use in preparation of a photomask used in, for example, semiconductor device fabrication, as well as to a protective film for the mask blank and to a method of patterning the mask blank.

2. Description of the Related Art

With an increasing demand on higher density packing of semiconductor devices, micromachining techniques have been developed. To precisely transfer a fine pattern, a highly precise mask pattern is required. Such a mask is generally patterned by application of electron beams. However, as the devices are squeezed into tighter and tighter dimension and the number of traces written by means of electron beams increases, it takes a long time to write traces and thereby the productivity of the mask is decreased.

Alternatively, the mask can be patterned by the use of a chemically amplified resist film. The chemically amplified resist film has been used for patterning of a resist with high sensitivity by using an acid catalytic mechanism, and use thereof in patterning of the mask blank may shorten the imaging or writing time of the mask pattern.

In the chemically amplified resist film, an acid is generated in portions where activating light or radiation such as electron beams or ultraviolet light is applied, and the generated acid decomposes a dissolution inhibitor which inhibits the resist film from dissolving in bases, and thus the resist film become soluble in bases.

Such chemically amplified resist films are commercially available, for example, from FUJIFILM OLIN Co., Ltd. under the trade name of FEP-171 and from Tokyo Ohka Kogyo Co., Ltd. under the trade name of EP-009.

FIGS. 6A through 6E are views illustrating a process for fabrication of a photomask by patterning such a conventional chemically amplified resist film. The figures show a substrate 1, a light-block film 2, a chemically amplified resist film 3, and activating light or radiation 4 such as electron beams or ultraviolet light.

The quartz substrate 1 carries the light-block film 2 formed thereon. The light-block film 2 has a film thickness of 50 to 300 nm and is made of, for example, chromium (Cr) or MoSiON. Initially, the chemically amplified resist is applied onto the light-block film 2 to a film thickness of 100 to 500 nm and thereby yields the chemically amplified resist film 3. The substrate 1 is then subjected to first heating treatment (prebaking) and thereby yields a mask blank (FIG. 6A).

The mask blank is then irradiated with electron beams in vacuo at an accelerating voltage of 10 to 50 kV or with ultraviolet rays in the air (FIG. 6B). In this procedure, the mask blank is patterned by writing desired traces one by one by means of electron beams or ultraviolet rays.

An acid is generated only in exposed portions of the chemically amplified resist film 3 which are exposed to activating light or radiation. When the substrate 1 is subjected to second heating treatment after exposure (post exposure baking, PEB), the acid in the chemically amplified resist film 3 acts as a catalyst, decomposes most of a dissolution inhibitor and makes the exposed portions soluble in bases to thereby pattern the chemically amplified resist film 3.

Specifically, the exposed mask blank is developed with a developing solution to thereby pattern the chemically amplified resist film 3 on the light-block film 2 (FIG. 6C).

When the light-block film 2 is made of Cr, it is subjected to magnetic field applied reactive ion etching using a gaseous mixture of chlorine or hydrogen chloride with oxygen at an applied magnetic field strength of 50 G for 10 minutes to thereby transfer the written traces of the resist to the Cr film (FIG. 6D).

When the light-block film 2 is made of MoSiON, it is subjected to magnetic field applied reactive ion etching using a gaseous mixture of carbon tetrafluoride and oxygen at an applied magnetic field strength of 50 G for 5 minutes to thereby transfer the written traces of the resist to the MoSiON film as in the Cr film (FIG. 6D).

The patterned resist, after etching, is stripped using an oxygen ashing system or a resist stripper solution and thereby yields a photomask (FIG. 6E).

The photomask is fabricated according to the above process. However, with downsizing of semiconductor devices and with an increasing number of traces to be written, it takes about 6 to 40 hours and, on average, about 12 hours to write traces in one mask blank (FIG. 6B).

The highly sensitive chemically amplified resist is used to shorten the time to write or image traces of the mask, but still it takes several hours to image the traces and thereby induces changes in finished dimension.

In addition, when the mask blank is stored over a long period of time, the finished dimension also changes.

These problems are probably induced for the following reasons. Specifically, a chemically amplified resist for use in the mask blank is configured in such a manner that it enhances decomposition reactions by action of a trace amount of an acid catalyst in order to achieve high sensitivity. However, a basic substance migrates into the mask blank during exposure or storage of the mask blank, neutralizes the acid generated upon irradiation of activating light or radiation and thereby significantly deteriorates decomposition reactions by action of the acid catalyst. Thus, the pattern dimension is significantly changed, an insolubilized surface layer is formed, or the traces are not resolved.

Specifically, when the resist is exposed and patterned in vacuo, the acid evaporates and significantly deteriorates the decomposition reaction by catalysis of the acid catalyst to thereby significantly affect the pattern dimension.

To avoid these problems, a protective film is formed on the chemically amplified resist film. For example, Japanese Patent Laid-Open Nos. 5-216244, 6-95397 and 7-209875 each disclose a technique in which a film of a water-soluble resin or a neutral organic (water-insoluble) resin is formed on the chemically amplified resist film 3 for mask fabrication to thereby prevent diffusion of such a basic substance into the resist film.

However, the formation of such protective film made of a water-soluble resin or neutral organic resin only enables stable patterning for a very short time.

This is because, even when the protective film is formed on the chemically amplified resist film of the mask blank, basic substances in the atmospheric air permeate the protective films during exposure or storage of the mask blank and then migrate and diffuse into the chemically amplified resist film.

In addition, the use of the protective film does not sufficiently prevent the acid from evaporating during exposure of the mask blank in vacuo.

Specifically, the conventional protective films can only effectively act for a short time and do not enable highly precise and stable patterning of the mask blank which must be stable over a long period of time.

SUMMARY OF THE INVENTION

Accordingly, an object of the present invention is to provide a mask blank which can stably be stored, and a mask for use in the mask blank. Another object of the present invention is to provide a method of patterning the mask blank which enables highly precise and stable patterning.

Specifically, the present invention provides, in one aspect, a mask blank including a substrate, a light-block film formed on the substrate, a chemically amplified resist film formed on the light-block film, and a protective film formed on the chemically amplified resist film. In this mask blank, the chemically amplified resist film includes a photosensitive acid generator and mainly contains a first resin. The photosensitive acid generator generates an acid upon irradiation with active light or radiant ray, and the first resin becomes soluble in bases by action of an acid. The protective film includes the photosensitive acid generator and mainly contains a second resin. The second resin is soluble in a solvent that does not substantially dissolve the first resin. The mask blank can be patterned with satisfactory dimensional precision and can be stored over a long period of time.

In the mask blank, the first resin is preferably a resin that becomes soluble in an aqueous base solution by action of an acid and the second resin is preferably a water-insoluble resin. This configuration can improve uniformity of the applied chemically amplified resist film and protective film.

In another aspect, the present invention provides a protective film for use in the mask blank. The protective film includes a photosensitive acid generator and mainly contains a second resin. The photosensitive acid generator generates an acid upon irradiation with active light or radiant ray, and the second resin is soluble in a solvent that does not substantially dissolve the first resin. The protective film can reduce in-plane dimensional changes over a long period of time.

In addition and advantageously, the present invention provides a method of patterning a mask blank. The method includes the steps of subjecting the mask blank to patternwise irradiation with active light or radiant ray; dissolving and removing the protective film of the mask blank with a solvent that does not substantially dissolve the chemically amplified resist film of the mask blank; and developing the chemically amplified resist film. The method can pattern the mask blank with satisfactory dimensional precision.

DETAILED DESCRIPTION OF THE INVENTION

First Embodiment

Figure 1:
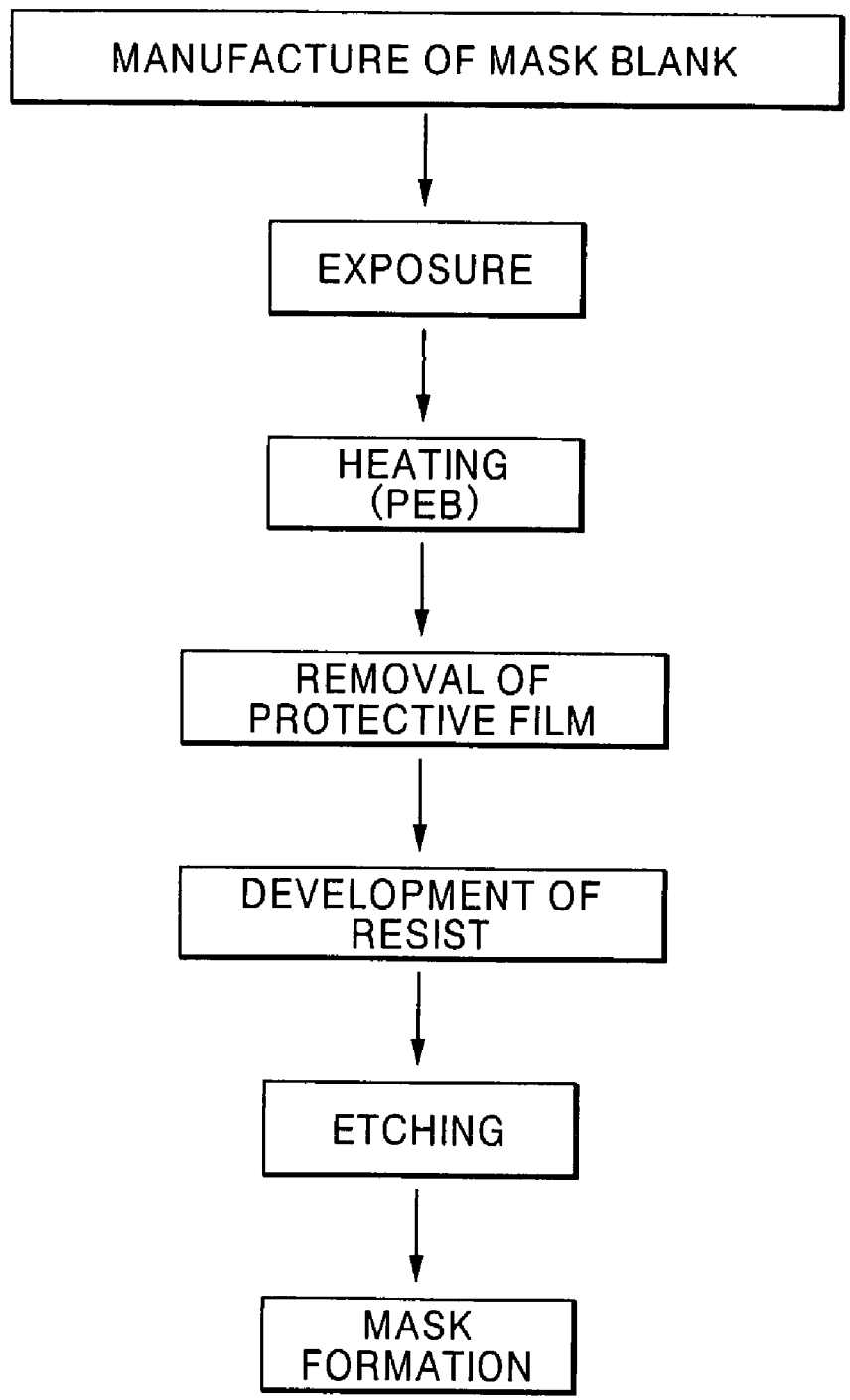
FIG. 1 is a flow chart showing a process of manufacturing a photomask using a mask blank according to an embodiment of the present invention.

FIG. 1 is a flow chart showing a process for manufacturing a photomask using a mask blank according to an embodiment of the present invention, and FIGS. 2A through 2E are outlined cross-sectional views illustrating the manufacturing process shown in FIG. 1.

FIGS. 2A through 2E illustrate a substrate 1, a light-block film 2, a chemically amplified resist film 3, active light or radiant ray 4 such as electron beams or ultraviolet rays, a protective film 5 and a mask blank 6. The chemically amplified resist film 3 herein comprises a photosensitive acid generator and mainly contains a first resin. The photosensitive acid generator generates an acid upon irradiation with active light or radiant ray such as electron beams or ultraviolet rays, and the first resin becomes soluble in bases by action of an acid.

The mask blank according to the first embodiment comprises the substrate 1, the light-block film 2, the chemically amplified resist film 3 and the protective film 5. Specifically, the protective film 5 includes the same photosensitive acid generator as in the chemically amplified resist film 3 and mainly contains a second resin. The second resin is soluble in a solvent that does not substantially dissolve the first resin in the chemically amplified resist film 3.

The mask blank can be manufactured, for example, according to the following process. Initially, a film of a chemically amplified resist is applied, by spin coating, onto the light-block film 2 made of, for example, chromium formed on the quartz substrate 1, the applied film is heated and dried and thereby yields the chemically amplified resist film 3.

Figure 2:
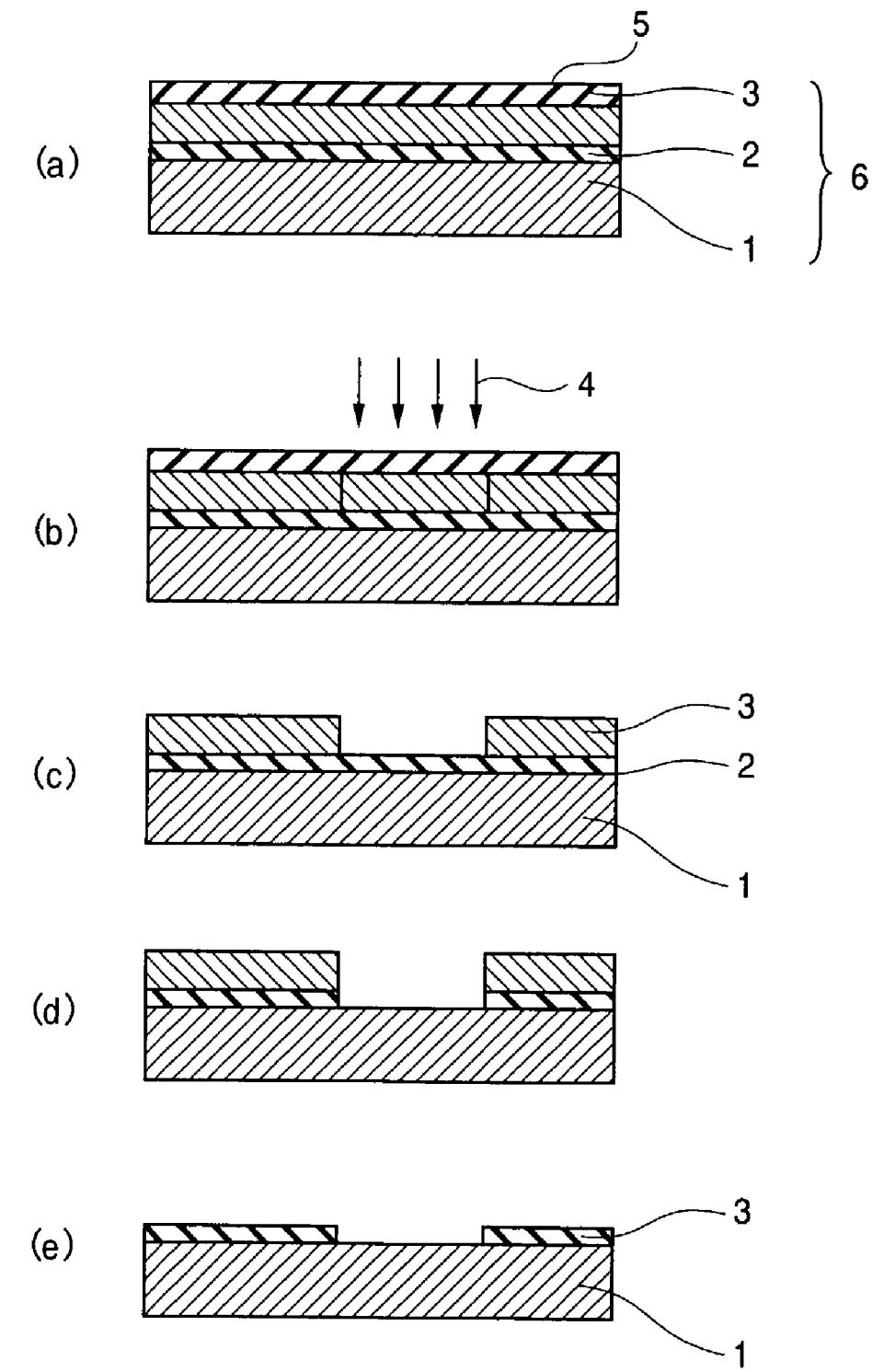
FIGS. 2A through 2E are cross-sectional views illustrating the manufacturing process of FIG. 1.

Next, the photosensitive acid generator and the second resin are dissolved in a solvent that does not substantially dissolve the first resin in the chemically amplified resist film 3. The resulting solution is applied onto the chemically amplified resist film 3, the resulting film is dried to yield the protective film 5 and thereby yields the mask blank 6 according to the first embodiment (FIG. 2A).

In general, mask blanks are distributed and are stored over a long period of time until they are subjected to exposure. During storage, basic substances in the air are also absorbed by the mask blanks from their surfaces.

Accordingly, such mask blanks for patterning have already absorbed the basis substances.

The mask blank according to the first embodiment comprises the protective film 5 including the photosensitive acid generator. When the mask blank is irradiated with active light or radiant ray, acids are generated in the chemically amplified resist film 3 and the protective film 5.

Even if a basic substance is absorbed by the mask blank during storage or exposure in the atmospheric air, the basic substance is trapped by the acid in the protective film 5 before it is neutralized with the acid in the chemically amplified resist film 3. Thus, the basic substance is prevented from diffusing into the chemically amplified resist film 3, and dimensional changes of the pattern can be prevented over a long period of time.

When the mask blank is irradiated with active light or radiant ray in vacuo, the acid in the protective film 5 evaporates ahead of the acid in the chemically amplified resist film 3 and thereby prevents the acid in the chemically amplified resist film 3 from evaporating to thereby prevent dimensional changes of the resulting pattern over a long period of time.

In contrast, when a mask blank carrying a conventional protective film containing no photosensitive acid generator is irradiated with active light or radiant ray for exposure, an acid generated in the chemically amplified resist film is consumed to neutralize such basic substances already absorbed by the mask blank. Thus, an acid catalytic reaction in the chemically amplified resist film which is required for patterning of the resist is adversely affected and the resist becomes unstable in pattern dimension.

A method of patterning the mask blank according to the first embodiment will be illustrated below.

The mask blank according to the first embodiment as shown in FIG. 2A is irradiated upon the chemically amplified resist film 3 with active light or radiant ray using, for example, an electron beam exposure system (FIG. 2B) and is then subjected to heat treatment to proceed an acid catalytic reaction.

Subsequently, the protective film 5 is removed with a solvent that does not substantially dissolve the chemically amplified resist film 3, and the naked chemically amplified resist film 3 is developed and thereby pattern the resist (FIG. 2C).

Using the patterned resist, the substrate is etched to thereby transfer the resist pattern to the light-block film 2 (FIG. 2D), the patterned resist after etching is removed and thereby yields a photomask (FIG. 2E).

The photomask manufactured by the use of the mask blank according to the first embodiment has high dimensional uniformity within the mask surface, and semiconductor devices manufactured by the use of the photomask also have high dimensional uniformity. Accordingly, the use of the mask blank can produce high quality semiconductor devices in high yields.

Such chemically amplified resist films for use in the mask blank according to the first embodiment can be formed by using, for example, chemically amplified resists commercially available as FEP-171 (trade name, available from FUJIFILM ARCH Co., Ltd.) and EP-009 (trade name, available from Tokyo Ohka Kogyo Co., Ltd.). Each of these chemically amplified resists comprises a photosensitive acid generator as exemplified below and a first resin that becomes soluble in bases by action of an acid.

In the mask blank according to the first embodiment, the first resin in the chemically amplified resist film 3 must not be dissolved when the protective film 5 is formed on the chemically amplified resist film 3 (FIG. 2A) or is removed therefrom (FIG. 2C). This configuration prevents mixing of the chemically amplified resist film and the protective film and thereby enables the patterning of the resist.

As the second resin in the protective film 5 according to the first embodiment, therefore, a resin which is soluble in a solvent that does not substantially dissolve the first resin is used. For example, when the first resin constituting the chemically amplified resist film 3 is one that becomes soluble in an aqueous basic solution by action of an acid, water-insoluble resins, neutral water-soluble resins or acidic water-soluble resins can be used as the second resin. Among them, water-insoluble resins are preferred as the second resin, since they can exhibit good coating property and improved uniformity of the resulting coated film.

Such first resins that become soluble in an aqueous basic solution include, but are not limited to, novolak resins; polyhydroxystyrenes; resins derived from polyhydroxystyrenes in which part of hydroxyl groups of the polyhydroxystyrenes are substituted by tert-butoxycarbonyl group or other carboxylate groups, acetal groups (e.g., methoxymethyl group and ethoxyethyl group) or ketal groups (e.g., methoxyisopropenyl group); resins obtained by copolymerization between hydroxystyrene and tert-butyl acrylate or tert-butyl methacrylate; resins obtained by copolymerization between a monomer such as hydroxystyrene, tert-butyl acrylate or tert-butyl methacrylate and a monomer such as styrene or methyl acrylate. These resins may further comprise amine compounds and/or amide compounds to control the sensitivity and to improve the stability of the resist.

The water-insoluble resins for use herein mean and include resins that are soluble in water-insoluble solvents (solvents that are immiscible with water) and are insoluble in water or in solvents that are miscible with water.

Such water-insoluble resins for use as the second resin include, for example, alkenes, substituted alkenes, cycloalkenes, ring-opening polymers of cycloalkenes or hydrogenated products thereof, and other polymers.

Examples of such polymers are homo- or co-polymers of ethylene, propylene, butylene, isobutene, butadienes, 3-methyl-1-butene, pentenes, 4-methyl-1-pentene, styrene, α-methylstyrene, 4-methylstyrene, cyclopentene, cyclohexene, norbornene, methylnorbornene, cyclohexylnorbornene, tricyclodecene, tetracyclododecene or methyltetracyclododecene.

The water-insoluble resins each preferably have a weight average molecular weight of from 500 to 100000, and more preferably from 1000 to 50000. The water-insoluble resins each having a molecular weight within this range can yield satisfactorily uniform films.

To form the protective film in the mask blank according to the first embodiment, the second resin and the photosensitive acid generator as exemplified below are dissolved in a solvent in such an amount that the total weight of the second resin and the photosensitive acid generator ranges from 5% to 30% by weight, and the resulting solution is applied onto the chemically amplified resist film 3. Such solvents must dissolve the second resin and the photosensitive acid generator and must not substantially dissolve the first resin constituting the chemically amplified resist film 3. When the water-insoluble resin is used as the second resin, the solvents for use herein include the following solvents.

Specifically, such solvents include, but are not limited to, toluene, xylene, ethylbenzene, cumene, butylbenzene, mesitylene, cymene, diethylbenzene, methylcyclohexane, ethylcyclohexane, propylcyclohexane, butylcyclohexane, trimethylcyclohexane, pinene, limonene, and other hydrocarbon solvents. The solvents may be mixtures of these hydrocarbon solvents with alcohols or esters. Such alcohols include, but are not limited to, isopropanol, 1-butanol, 2-butanol, 2-methyl-1-propanol, 2-methyl-2-propanol, 1-pentanol, 2-pentanol, 3-pentanol, 2-methyl-1-butanol, 3-methyl-1-butanol, 2-methyl-2-butanol, 3-methyl-2-butanol, 1-hexanol, 2-hexanol, 3-hexanol, 4-hexanol, 2-methyl-1-pentanol, 1-methyl-1-pentanol, 4-methyl-2-pentanol and 2-ethyl-1-butanol. Such esters include, but are not limited to, n-amyl acetate, isoamyl acetate, n-butyl acetate, isobutyl acetate, 2-methylbutyl acetate, isopropyl propionate, isobutyl propionate, n-butyl propionate, isoamyl propionate, n-amyl propionate, n-propyl butyrate, isopropyl butyrate, n-butyl isobutyrate and isopropyl isobutyrate.

The content of the alcohols or esters in the mixtures with the hydrocarbon solvents is preferably from 1% to 30% by weight based on the total weight of the mixtures. These solvents may preferably have a boiling point of from 100° C. to 220° C. Solvents having a boiling point lower than this range may often induce irregular or uneven coating, and those having a boiling point higher than this range may not easily be dried.

The proportion of the photosensitive acid generator in the mask blank according to the first embodiment is preferably from 0.01 to 20 parts by weight, and more preferably from 0.1 to 10 parts by weight, relative to 100 parts by weight of the second resin. If the proportion of the photosensitive acid generator is out of the above range, the resulting patterned resist may have an undesired shape.

Photosensitive acid generators for use herein include, but are not limited to, phenacyl phenyl sulfone, mesityl phenacyl sulfone, bis(phenylsulfonyl)methane, bis(phenylsulfonyl)diazomethane, 4-trisphenacyl sulfone, benzoin tosylate, pyrogallol tristriflate, nitrobenzyl-9,10-diethoxyanthracene-2-sulfonate, N-(trifluoromethylsulfonyloxy)maleimide, N-(trifluoromethylsulfonyloxy)phthalimide, diphenyliodonium trifluoromethanesulfonate, diphenyliodonium nonafluorobutanesulfonate, diphenyliodonium pyrenesulfonate, diphenyliodonium dodecylbenzenesulfonate, diphenyliodonium toluenesulfonate, diphenyliodonium benzenesulfonate, diphenyliodonium camphorsulfonate, diphenyliodonium hexafluoroantimonate, bis(tert-butylphenyl)iodonium trifluoromethanesulfonate, bis(tert-butylphenyl)iodonium nonafluorobutanesulfonate, bis(tert-butylphenyl)iodonium pyrenesulfonate, bis(tert-butylphenyl)iodonium dodecylbenzenesulfonate, bis(tert-butylphenyl)iodonium toluenesulfonate, bis(tert-butylphenyl)iodonium benzenesulfonate, bis(tert-butylphenyl)iodonium camphorsulfonate, bis(tert-butylphenyl)iodonium hexafluoroantimonate, methoxyphenylphenyliodonium trifluoromethanesulfonate, methoxyphenylphenyliodonium nonafluorobutanesulfonate, methoxyphenylphenyliodonium pyrenesulfonate, methoxyphenylphenyliodonium dodecylbenzenesulfonate, methoxyphenylphenyliodonium toluenesulfonate, methoxyphenylphenyliodonium benzenesulfonate, methoxyphenylphenyliodonium camphorsulfonate, methoxyphenylphenyliodonium hexafluoroantimonate, triphenylsulfonium trifluoromethanesulfonate, triphenylsulfonium nonafluorobutanesulfonate, triphenylsulfonium pyrenesulfonate, triphenylsulfonium dodecylbenzenesulfonate, triphenylsulfonium toluenesulfonate, triphenylsulfonium benzenesulfonate, triphenylsulfonium camphorsulfonate, triphenylsulfonium hexafluoroantimonate, methoxyphenyldiphenylsulfonium trifluoromethanesulfonate, methoxyphenyldiphenylsulfonium nonafluorobutanesulfonate, methoxyphenyldiphenylsulfonium pyrenesulfonate, methoxyphenyldiphenylsulfonium dodecylbenzenesulfonate, methoxyphenyldiphenylsulfonium toluenesulfonate, methoxyphenyldiphenylsulfonium benzenesulfonate, methoxyphenyldiphenylsulfonium camphorsulfonate, methoxyphenyldiphenylsulfonium hexafluoroantimonate, phenylthiophenyldiphenylsulfonium trifluoromethanesulfonate, phenylthiophenyldiphenylsulfonium nonafluorobutanesulfonate, phenylthiophenyldiphenylsulfonium pyrenesulfonate, phenylthiophenyldiphenylsulfonium dodecylbenzenesulfonate, phenylthiophenyldiphenylsulfonium toluenesulfonate, phenylthiophenyldiphenylsulfonium benzenesulfonate, phenylthiophenyldiphenylsulfonium camphorsulfonate, phenylthiophenyldiphenylsulfonium hexafluoroantimonate, succiniminoxysulfonium trifluoromethanesulfonate, succiniminoxysulfonium nonafluorobutanesulfonate, succiniminoxysulfonium pyrenesulfonate, succiniminoxysulfonium dodecylbenzenesulfonate, succiniminoxysulfonium toluenesulfonate, succiniminoxysulfonium benzenesulfonate, succiniminoxysulfonium camphorsulfonate, succiniminoxysulfonium hexafluoroantimonate, maleiminoxysulfonium trifluoromethanesulfonate, maleiminoxysulfonium nonafluorobutanesulfonate, maleiminoxysulfonium pyrenesulfonate, maleiminoxysulfonium dodecylbenzenesulfonate, maleiminoxysulfonium toluenesulfonate, maleiminoxysulfonium benzenesulfonate, maleiminoxysulfonium camphorsulfonate, maleiminoxysulfonium hexafluoroantimonate, phthaliminoxysulfonium trifluoromethanesulfonate, phthaliminoxysulfonium nonafluorobutanesulfonate, phthaliminoxysulfonium pyrenesulfonate, phthaliminoxysulfonium dodecylbenzenesulfonate, phthaliminoxysulfonium toluenesulfonate, phthaliminoxysulfonium benzenesulfonate, phthaliminoxysulfonium camphorsulfonate, phthaliminoxysulfonium hexafluoroantimonate, norbornenedicarboximinoxysulfonium trifluoromethanesulfonate, norbornenedicarboximinoxysulfonium nonafluorobutanesulfonate, norbornenedicarboximinoxysulfonium pyrenesulfonate, norbornenedicarboximinoxysulfonium dodecylbenzenesulfonate, norbornenedicarboximinoxysulfonium toluenesulfonate, norbornenedicarboximinoxysulfonium benzenesulfonate, norbornenedicarboximinoxysulfonium camphorsulfonate, norbornenedicarboximinoxysulfonium hexafluoroantimonate, naphthalenedicarboximinoxysulfonium trifluoromethanesulfonate, naphthalenedicarboximinoxysulfonium nonafluorobutanesulfonate, naphthalenedicarboximinoxysulfonium pyrenesulfonate, naphthalenedicarboximinoxysulfonium dodecylbenzenesulfonate, naphthalenedicarboximinoxysulfonium toluenesulfonate, naphthalenedicarboximinoxysulfonium benzenesulfonate, naphthalenedicarboximinoxysulfonium camphorsulfonate, and naphthalenedicarboximinoxysulfonium hexafluoroantimonate. Each of these compounds can be used alone or in combination.

EXAMPLES

The present invention will be illustrated in further detail with reference to several examples and comparative examples below, which are not intended to limit the scope of the invention.

Example 1

A film of a chemically amplified resist (available from FUJIFILM Arch Co., Ltd. under the trade name of FEP-171) was applied to a thickness of 0.4 µm onto a 6-inch square quartz substrate carrying a chromium film formed thereon, was dried on a hot plate at 110° C. for 10 minutes and thereby yielded a chemically amplified resist film.

Separately, 95 parts by weight of poly(α-methylstyrene) (available from Aldrich, number average molecular weight: 4000) and 5 parts by weight of bis(tert-butylphenyl)iodonium nonafluorobutanesulfonate were dissolved in cumene and thereby yielded a solution. A film of the solution as a photosensitive protective film according to the present invention was then applied onto the chemically amplified resist film to a thickness of 0.1 µm and thereby yielded a mask blank.

Next, traces ranging from 1.0 µm to 0.2 µm were patterned on the mask blank using an electron beam exposure system (available from JEOL Ltd. under the trade name of JBX-6000 FX).

The exposed mask blank was heated at 110° C. for 10 minutes, the photosensitive protective film was removed using cumene, the chemically amplified resist film was then developed using a basic developing solution (available from Tokyo Ohka Kogyo Co., Ltd. under the trade name of NMD-3) and thereby pattern the resist. In this procedure, the resist was patterned with a good shape in exact accordance with the designed dimension at an exposure of 6.5 $\mu C/cm^2$. Thereafter, a photomask was manufactured in the same manner as in FIGS. 2D and 2E.

Example 2

A mask blank was manufactured in the same manner as in Example 1.

The mask blank was patterned to a size of 400 nm in the same manner as in Example 1, except the following procedure. Specifically, in Example 1, the mask blank was exposed to electron beams and thereby patterned immediately after its manufacture. However, in Example 2, the time lag between manufacture and exposure of the mask blank, i.e., the time period between the step of FIG. 2A and the step of FIG. 2B, was varied. During this time period, the mask blank was left in the air.

Comparative Example 1

A mask blank was manufactured in the same manner as in Example 2, except that the protective film of the mask blank contained no photosensitive acid generator. The mask blank was then patterned while the time lag between the manufacture and exposure of the mask blank was changed in the same manner as in Example 2.

Comparative Example 2

A mask blank was manufactured in the same manner as in Example 2, except that the mask blank carried no protective film. The mask blank was then patterned while the time lag between the manufacture and exposure of the mask blank was changed in the same manner as in Example 2.

Figure 3:
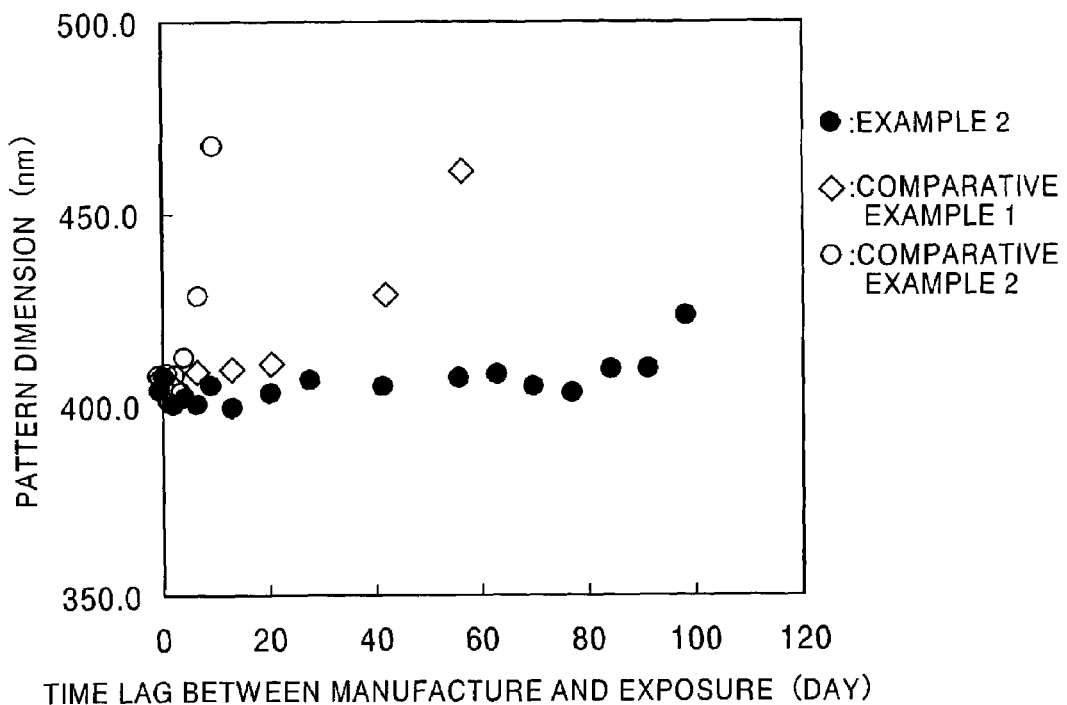
FIG. 3 is a diagram showing the relationship between the pattern dimension and the time lag between manufacture and exposure of a mask blank.

FIG. 3 is a diagram showing the relationship between the pattern dimension and the time lag between manufacture and exposure of a mask blank. In FIG. 3, comparisons were made on pattern dimensions of the patterned resists according to Example 2 using the mask blank of the present invention, Comparative Example 1 using a mask blank carrying a protective film including no photosensitive acid generator, and Comparative Example 2 using a mask blank carrying no protective film, respectively.

FIG. 3 shows that the patterned resist according to Comparative Example 2 using the mask blank carrying no protective film changed in pattern dimension with an increasing time lag between its manufacture and exposure, and the resist could not be patterned when the mask blank was left for more than one week after its manufacture.

The patterned resist according to Comparative Example 1 using the mask blank carrying a protective film containing no photosensitive acid generator exhibited less change in pattern dimension as compared with the patterned resist according to Comparative Example 2, but exhibited changes in pattern dimension when the mask blank was left for more than one month after its manufacture.

These results show that the conventional protective film only enables stable patterning (stable pattern dimension) for a short and limited time and cannot sufficiently prevent basic substances in the air from diffusing into the chemically amplified resist film.

In contrast, the patterned resist according to Example 2 using the mask blank of the present invention showed no change in pattern dimension even when the mask blank was left for more than three months after its manufacture.

These results show that the addition of the photosensitive acid generator into the protective film increases stability in pattern dimension of the resist even if time lag between manufacture and exposure of the chemically amplified resist film is increased. Accordingly, the resulting mask blank is excellent in storage stability.

This is probably for the following reasons. The protective film in the mask blank of the present invention can prevent basic substances in the air from migrating into the mask blank to some extent. In addition, when the mask blank is exposed to active light or radiant ray, an acid is also generated in exposed portions of the protective film by action of the photosensitive acid generator in the protective film, and the generated acid neutralizes basic substances which have migrated into the protective film and thereby prevents the basic substances from diffusing into the chemically amplified resist film. Thus, the acid prevents the basis substances from adversely affecting the acid catalytic reaction in the chemically amplified resist film which is necessary for patterning of the resist.

Example 3

A mask blank was manufactured in the same manner as in Example 1. Subsequently, the mask blank was irradiated with electron beams to thereby pattern to a size of 400 nm in the same manner as in Example 1, except the following procedure. Specifically, in Example 1, the mask blank was heated immediately after its exposure to electron beams. However, in Example 3, the time lag between exposure and heating of the mask blank (post exposure baking, PEB) was varied. During this time period, the mask blank was left in an electron beam exposure system. Specifically, Example 3 was performed to verify the relationship between the stability in resist pattern dimension and the time lag between exposure to electron beams and heat treatment (post exposure baking) of the mask blank when the mask blank was left in vacuo.

Comparative Example 3

A mask blank was manufactured in the same manner as in Example 3, except that the protective film of the mask blank contained no photosensitive acid generator. The mask blank was then patterned while the time lag between exposure and post exposure baking of the mask blank was changed in the same manner as in Example 3.

Comparative Example 4

A mask blank was manufactured in the same manner as in Example 3, except that the mask blank carried no protective film. The mask blank was then patterned while the time lag between exposure and post exposure baking of the mask blank was changed in the same manner as in Example 3.

Figure 4:
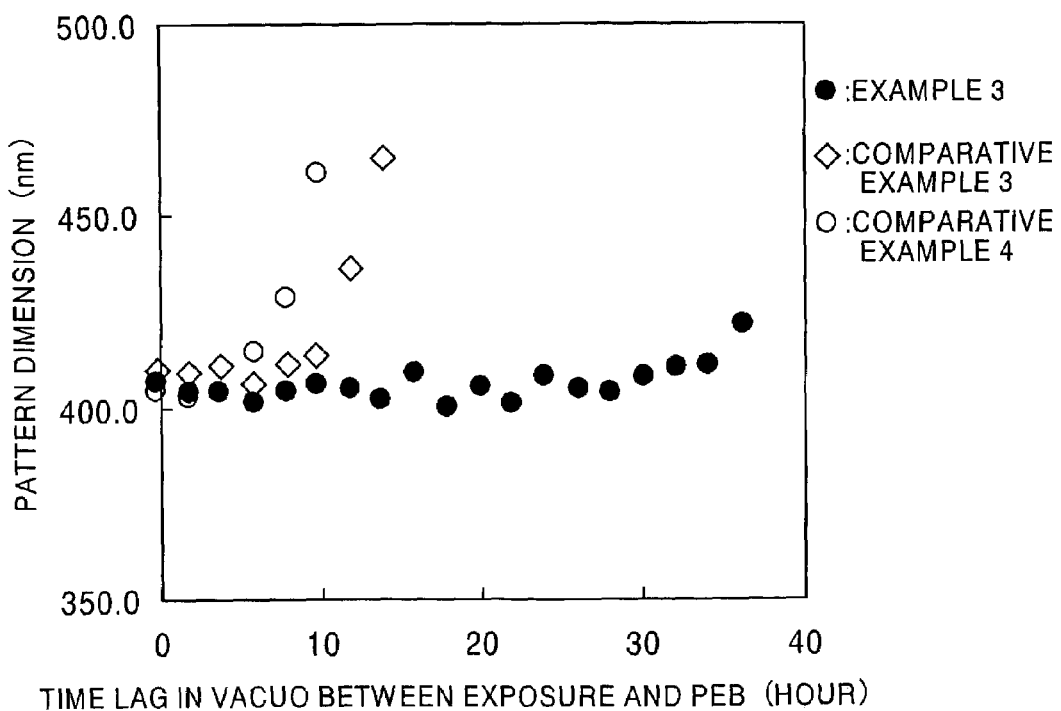
FIG. 4 is a diagram showing the relationship between the pattern dimension and the time lag between exposure and post exposure baking when the mask blank is left in an electron beam exposure system after exposure.

FIG. 4 is a diagram showing the relationship between the pattern dimension and the time lag between exposure and post exposure baking when the mask blank was left in an electron beam exposure system after exposure. In FIG. 4, comparisons were made on pattern dimensions of the patterned resists according to Example 3 using the mask blank of the present invention, Comparative Example 3 using a mask blank carrying a protective film containing no photosensitive acid generator, and Comparative Example 4 using a mask blank carrying no protective film, respectively.

FIG. 4 shows that the patterned resist according to Comparative Example 4 using the mask blank carrying no protective film significantly changed in pattern dimension when the mask blank was left in the electron beam exposure system for six hours or more after its exposure. The patterned resist according to Comparative Example 3 using the mask blank carrying a protective film containing no photosensitive acid generator also significantly changed in pattern dimension when the mask blank was left for 10 hours or more after its exposure. These results show that the conventional protective film cannot effectively prevent the pattern dimension from changing when the mask blank is left in vacuo after its exposure.

In contrast, the patterned resist according to Example 3 using the mask blank of the present invention showed no change in pattern dimension even when the mask blank was left in vacuo for 24 hours or more after its exposure.

These results show that the mask blank carrying the protective film containing the photosensitive acid generator can keep the concentration of an acid in the chemically amplified resist film constant over a long period of time even when the mask blank is left in vacuo after exposure, i.e., the time to write the traces is prolonged. This is because an acid generated in the protective film evaporates ahead of evaporation of the acid in the chemically amplified resist.

In contrast, the mask blanks carrying no protective film or carrying the protective film containing no photosensitive acid generator exhibit changes in pattern dimension, since a generated acid evaporates immediately after exposure and the concentration of the acid in the chemically amplified resist film varies.

Specifically, the acid generated upon irradiation with active light or radiant ray gradually evaporates in high vacuum, such as in an electron exposure system, and thereby induces changes in pattern dimension. However, the protective film used in the mask blank according to Example 3 can prevent evaporation of the acid and can thereby yield stable pattern dimension over a long period of time.

Example 4

A mask blank was manufactured in the same manner as in Example 1. Subsequently, the mask blank was irradiated with electron beams to thereby pattern to a size of 400 nm in the same manner as in Example 1, except the following procedure. Specifically, in Example 1, the mask blank was heated immediately after its exposure. However, in Example 4, the time lag between exposure and heating (post exposure baking) of the mask blank was varied. During this time period, the mask blank was left in the air. Specifically, Example 4 was performed to verify the relationship between the stability in resist pattern dimension and the time lag between exposure to electron beams and heat treatment (post exposure baking) of the mask blank when the mask blank was left in the air.

Comparative Example 5

A mask blank was manufactured in the same manner as in Example 4, except that the protective film of the mask blank contained no photosensitive acid generator. The mask blank was then patterned while the time lag between exposure and post exposure baking of the mask blank was changed in the same manner as in Example 4.

Comparative Example 6

A mask blank was manufactured in the same manner as in Example 4, except that the mask blank carried no protective film. The mask blank was then patterned while the time lag between exposure and post exposure baking of the mask blank was changed in the same manner as in Example 4.

Figure 5:
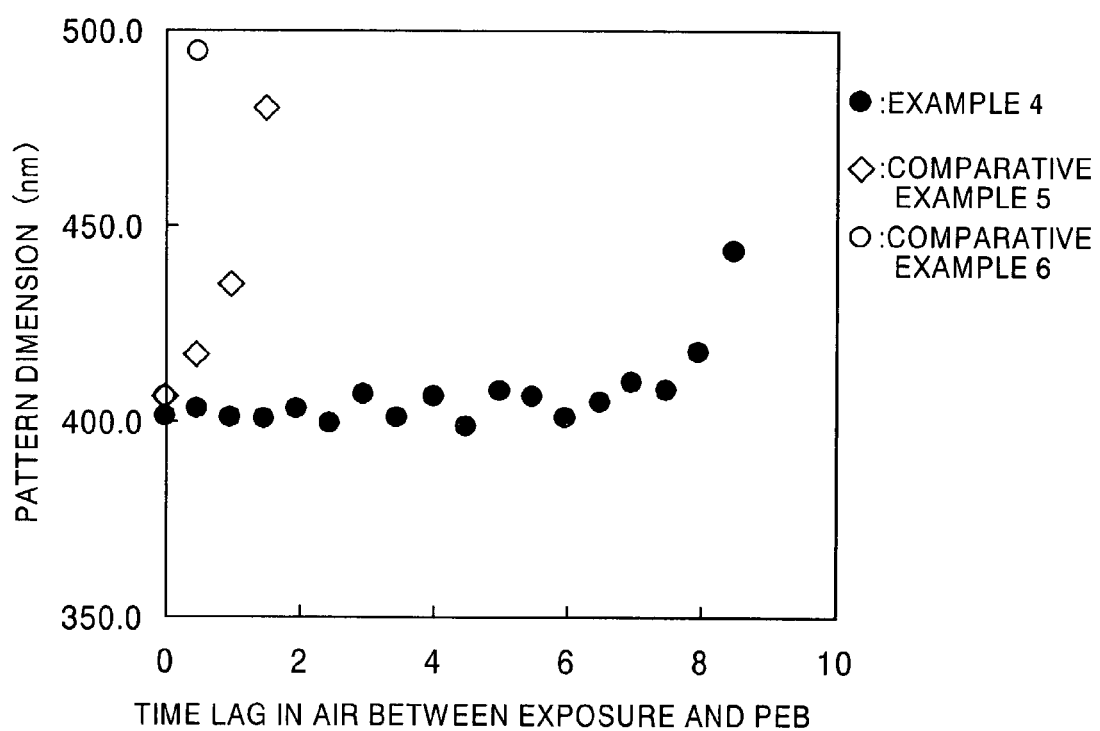
FIG. 5 is a diagram showing the relationship between the pattern dimension and the time lag between exposure and post exposure baking when the mask blank is left in the air after exposure.
Figure 6:
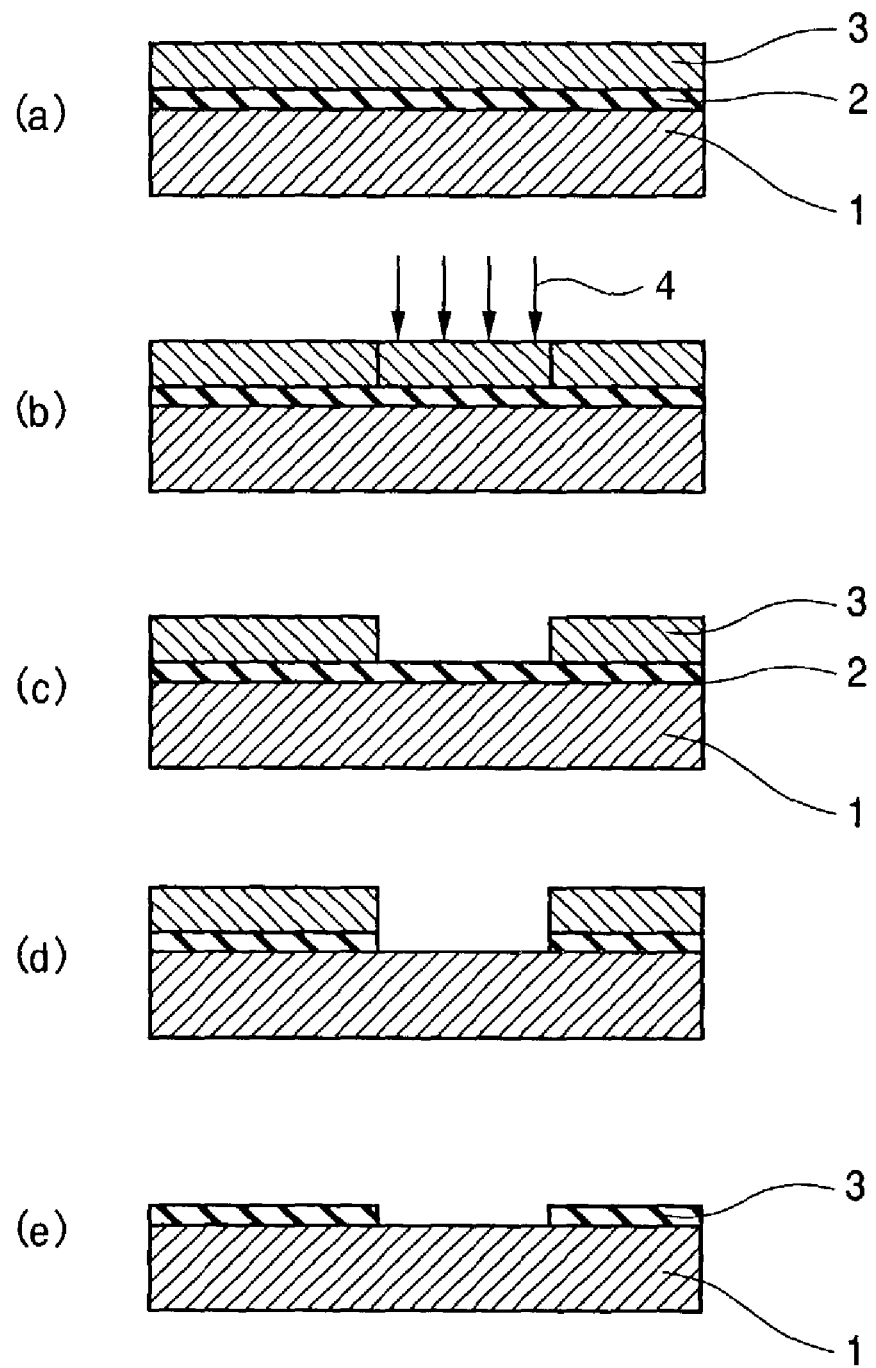
FIGS. 6A through 6E are cross-sectional views illustrating a process of manufacturing a photomask by patterning a conventional chemically amplified resist film.

FIG. 5 is a diagram showing the relationship between the pattern dimension and the time lag between exposure and post exposure baking when the mask blank was left in the air after exposure. In FIG. 5, comparisons were made on pattern dimensions of the patterned resists according to Example 4 using the mask blank of the present invention, Comparative Example 5 using a mask blank carrying a protective film containing no photosensitive acid generator, and Comparative Example 6 using a mask blank carrying no protective film, respectively.

FIG. 5 shows that the use of the mask blank carrying no protective film according to Comparative Example 6 and of the mask blank carrying the protective film containing no photosensitive acid generator according to Comparative Example 5 could not yield separated patterns when the mask blanks were left in the air after exposure for about one hour or more, although they could pattern the resists immediately after exposure.

In contrast, the patterned resist according to Example 4 using the mask blank of the present invention exhibited stable pattern dimension even when the mask blank was left in the air for about eight hours after exposure.

This is probably for the following reasons. In the mask blank carrying no protective film according to Comparative Example 6 and the mask blank carrying the protective film containing no photosensitive acid generator according to Comparative Example 5, the chemically amplified resist films after exposure include acids generated upon irradiation and rapidly absorb basic substances in the air to thereby adversely affect the pattern dimension within a very short time of one hour.

In contrast, in the mask blank of the present invention (Example 4), an acid generated in the protective film traps basic substances in the air before an acid in the chemically amplified resist film is neutralized with the basic substances. Thus, the mask blank exhibits no change in pattern dimension even when it is left in the air over a long period of time after exposure.

Examples 5 Through 10

Using materials for the protective films indicated in Table 1, mask blanks were manufactured and were patterned by the patterning procedure of Example 1. The definition (resolution) and long-term stability of the resulting patterned resists were determined as the time lag between manufacture and exposure (manufacture-exposure period) and the time lag between exposure and post exposure baking (exposure-PEB period) when the mask blanks were left in the air at which the dimensional variation of the obtained 400-nm pattern became 40 nm. The results are shown in Table 1.

In Table 1, water-insoluble resins were used in the protective films in Examples 5 through 8, and water-soluble resins were used in the protective films in Examples 9 and 10.

TABLE 1

|  | Materials for Protective Film | Definition (nm) | Manufacture-Exposure Period (day) | Exposure-PEB Period (in the air) (hour) |
|---|---|---|---|---|
| Ex. 5 | Resin: α-Methylstyrene<br>Acid Generator: Triphenylsulfonium triflate<br>Solvent: Mixture of ethylcyclohexane and tert-amyl alcohol (9:1 by weight) | 200 | >90 | 8 |
| Ex. 6 | Resin: Styrene<br>Acid Generator: Bis (tert-butylphenyl) iodonium nonafluorobutanesulfonate<br>Solvent: Ethylbenzene | 200 | >90 | 8 |
| Ex. 7 | Resin: Hydrogenated methylnorbornene<br>Acid Generator: Bis (tert-butylphenyl) iodonium nonafluorobutanesulfonate<br>Solvent: Xylene | 200 | >90 | 8 |
| Ex. 8 | Resin: 4-Methylpentene<br>Acid Generator: Diphenyliodonium triflate<br>Solvent: Mixture of ethylcyclohexane and 4-methyl-2-pentanol (9:1 by weight) | 200 | >90 | 8 |
| Ex. 9 | Resin: Poly(acrylic acid)<br>Acid Generator: Diphenyliodonium triflate<br>Solvent: Water | 200 | >90 | 8 |
| Ex. 10 | Resin: Poly(vinyl methyl ether)<br>Acid Generator: Diphenyliodonium triflate<br>Solvent: Water | 200 | >90 | 8 |
| Com. Ex. 7 | Resin: Poly(acrylic acid)<br>Solvent: Water | 300 | 4 | 2 |
| Com. Ex. 8 | Resin: Poly(acrylamidopropanesulfonic acid)<br>Solvent: Water | 400 | 5 | 6 |
| Com. Ex. 9 | Resin: Poly(acrylic acid)<br>Acid: Toluenesulfonic acid<br>Solvent: Water | 500 | 7 | 4 |

Comparative Examples 7 and 8

A mask blank was manufactured in the same manner as in Example 1, except that the protective film contained a water-soluble resin and contained no photosensitive acid generator as shown in Table 1 was used. The mask blank was then patterned in the same manner as in Example 2 or 4. The definition and long-term stability of the resulting patterned resists are shown in Table 1.

Comparative Example 9

A mask blank was manufactured in the same manner as in Example 1, except that the protective film contained a water-soluble resin and toluene sulfonic acid as an acid and included no photosensitive acid generator, as shown in Table 1. The mask blank was then patterned in the same manner as in Example 2 or 4. The definition and long-term stability of the resulting patterned resist are shown in Table 1.

Table 1 shows that the mask blanks carrying the protective films containing no photosensitive acid generator could not keep their properties with an increasing time lag between manufacture and exposure of the mask blanks, and the definition of the resulting pattern was decreased when the protective film of the mask blank was highly acidic. This is probably because when the protective film is acidic, the acid in the protective film acts upon unexposed portions of the chemically amplified resist film, accelerates the decomposition reaction of the chemically amplified resist film, and thereby increases the solubility thereof. Accordingly, the dissolution contrast of the chemically amplified resist film is decreased to thereby deteriorate the definition.

In contrast, the protective films used in the mask blanks according to the examples of the present invention do not yield acids in unexposed portions but yield acids in exposed portions of the chemically amplified resist film, thus prevent the definition from deteriorating and can keep the properties of the mask blanks even if the time lag between exposure and PEB is increased.

Example 11

A photomask was manufactured using the patterned mask blank prepared in Example 1 and etching the underlayer chromium film with the use of an etching system. The resulting photomask yielded a 500-nm pattern having an in-plane dimension in terms of maximum-minimum range before and after etching of 7.8 nm.

The pattern was then transferred onto a silicon wafer using the above-prepared photomask and a KrF stepping projection aligner and thereby yielded a pattern having an in-plane dimension in terms of maximum-minimum range of 10.4 nm.

In contrast, a photomask was manufactured using the patterned mask blank prepared in Comparative Example 1 and etching the underlayer chromium film with the use of an etching system. The resulting photomask yielded a 500-nm pattern having an in-plane dimension in terms of maximum-minimum range before and after etching of 15.0 nm.

The pattern was then transferred onto a silicon wafer using the above-prepared photomask and a KrF stepping projection aligner and thereby yielded a pattern having an in-plane dimension in terms of maximum-minimum range of 18.2 nm.

These results show that the photomasks prepared by using the photosensitive protective films of the present invention have improved uniformity in their pattern dimension and the use of the photomasks can yield semiconductor devices having improved uniformity in pattern dimension.

Other embodiments and variations will be obvious to those skilled in the art, and this invention is not to be limited to the specific matters stated above.

As has been described, the present invention provides the mask blank comprising:
 a substrate;
 a light-block film formed on the substrate;
 a chemically amplified resist film formed on the light-block film, comprising a photosensitive acid generator and mainly containing a first resin, the photosensitive acid generator generating an acid upon irradiation with active light or radiant ray, and the first resin becoming soluble in bases by action of an acid; and
 a protective film formed on the chemically amplified resist film, comprising the photosensitive acid generator and mainly containing a second resin, the second resin being soluble in a solvent that does not substantially dissolve the first resin.

According to this constitution, the mask blank can be patterned with satisfactory dimensional precision and can be stored over a long period of time.

Further, the present invention provides the mask blank wherein the first resin is a resin that becomes soluble in an aqueous base solution by action of an acid and wherein the second resin is a water-insoluble resin.

This configuration can improve uniformity of the applied chemically amplified resist film and protective film.

Furthermore, the present invention provides the protective film for use in the mask blank as mentioned above, comprising a photosensitive acid generator and mainly containing a second resin, the photosensitive acid generator generating an acid upon irradiation with active light or radiant ray, and the second resin being soluble in a solvent that does not substantially dissolve the first resin.

According to this constitution, the protective film can reduce in-plane dimensional changes over a long period of time.

Still further, the present invention provides the method of patterning a mask blank, the method comprising the steps of:
 subjecting the mask blank as mentioned above to patternwise irradiation with active light or radiant ray;
 dissolving and removing the protective film of the mask blank with a solvent that does not substantially dissolve the chemically amplified resist film of the mask blank; and
 developing the chemically amplified resist film.

According to this constitution, the method can pattern the mask blank with satisfactory dimensional precision.

What is claimed is:

1. A method of patterning a mask blank, the method comprising:
 applying to a light-blocking film of a mask blank a chemically amplified resist film comprising a photosensitive acid generator and a first resin, the photosensitive acid generator generating an acid upon irradiation with activating light or radiation, the first resin becoming soluble in a base by action of the acid in response to the activating light or radiation;
 applying a protective film on the chemically amplified resist film, the protective film comprising the photosensitive acid generator and a second resin, the second resin, after irradiation with the activating light or radiation, being soluble in a solvent that does not substantially dissolve the first resin;
 exposing the protective film and the chemically amplified resist film to patterned irradiation of the activating light or radiation;
 dissolving and removing the protective film of the mask blank from the chemically amplified resist film with a solvent that does not substantially dissolve the chemically amplified resist film of the mask blank; and
 developing the chemically amplified resist film to reproduce the patterned irradiation.

2. The method according to claim 1 including exposing the protective film and the chemically amplified resist film with an electron beam as the radiation.

3. The method according to claim 1 including exposing the protective film and the chemically amplified resist film with electromagnetic radiation as the activating light.

4. The method according to claim 1 wherein the first resin, after exposure to the activating light or radiation becomes soluble, where exposed to the activating light or radiation, in an aqueous base solution due to generation of the acid and the second resin is water-insoluble after exposure to the activating light or radiation, and including dissolving and removing the protective film with a non-aqueous solvent.

5. The method according to claim 4 including developing the chemically amplified resist film with an aqueous base solution.

* * * * *